(12) United States Patent
Huang

(10) Patent No.: US 10,879,495 B2
(45) Date of Patent: Dec. 29, 2020

(54) ORGANIC LIGHT EMITTING DEVICE AND ARRAY SUBSTRATE

(71) Applicant: Wuhan China Star Optoelectronics Semiconductor Display Technology Co., Ltd., Wuhan (CN)

(72) Inventor: Jinchang Huang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 28 days.

(21) Appl. No.: 16/462,946

(22) PCT Filed: Mar. 6, 2019

(86) PCT No.: PCT/CN2019/077090
§ 371 (c)(1),
(2) Date: May 22, 2019

(87) PCT Pub. No.: WO2020/107739
PCT Pub. Date: Jun. 4, 2020

(65) Prior Publication Data
US 2020/0185653 A1  Jun. 11, 2020

(30) Foreign Application Priority Data
Nov. 30, 2018 (CN) .......................... 2018 1 1450197

(51) Int. Cl.
*H01L 51/52* (2006.01)
*G02B 5/02* (2006.01)

(52) U.S. Cl.
CPC ...... *H01L 51/5275* (2013.01); *H01L 51/5268* (2013.01); *G02B 5/0242* (2013.01)

(58) Field of Classification Search
CPC ......... H01L 51/5275; H01L 51/00–448; H01L 51/52–56; H01L 2933/0091; H01L 33/58;
(Continued)

(56) References Cited

U.S. PATENT DOCUMENTS

2004/0253427 A1* 12/2004 Yokogawa ........... G02B 5/0278
428/212
2011/0147701 A1* 6/2011 Ikemoto .............. H01L 51/5275
257/13
(Continued)

FOREIGN PATENT DOCUMENTS

CN    104508517    4/2015
CN    105209940    12/2015
(Continued)

*Primary Examiner* — Eric A. Ward

(57) ABSTRACT

An organic light emitting device and array substrate are provided. The organic light emitting device includes a light emitting structure layer having a light emitting side and a light extraction layer positioned on the light emitting side of the light emitting structure layer. The light extraction layer includes at least one refractive layer, each of the refractive layers includes a plurality of first light refraction bodies, a plurality of second light refraction bodies, and a polymer layer. In the organic light emitting device and the array substrate of the present invention, light extraction efficiency of the organic light emitting device can be increased by adding the light extraction layer to the organic light emitting structure. Moreover, the structure of the present invention is simple to set up, solving the problems that light extraction is difficult to be realized in prior art and realizing the preparation of a high-efficiency OLED device.

8 Claims, 2 Drawing Sheets

(58) Field of Classification Search
CPC ............. H01L 51/5243; H01L 51/5268; H01L 27/3246; G02B 5/0242
See application file for complete search history.

(56) References Cited

U.S. PATENT DOCUMENTS

| | | |
|---|---|---|
| 2014/0131669 A1* | 5/2014 | Park .................... H01L 51/5275 257/40 |
| 2015/0041779 A1* | 2/2015 | Park .................... H01L 51/5253 257/40 |
| 2015/0102325 A1* | 4/2015 | Lim ..................... G02B 5/0242 257/40 |
| 2015/0176797 A1 | 6/2015 | Inoue |
| 2015/0205015 A1* | 7/2015 | Tsuji .................... G02B 5/0242 359/599 |
| 2016/0054489 A1 | 2/2016 | Koshitouge et al. |
| 2017/0005295 A1* | 1/2017 | Takeda .................. H01L 51/56 |
| 2017/0018741 A1* | 1/2017 | Osawa ................ H01L 51/5268 |
| 2018/0076399 A1 | 3/2018 | Kim |

FOREIGN PATENT DOCUMENTS

| | | |
|---|---|---|
| CN | 107408629 | 11/2017 |
| KR | 10-2013-0051296 | 5/2013 |

\* cited by examiner

ORGANIC LIGHT EMITTING DEVICE AND ARRAY SUBSTRATE

RELATED APPLICATIONS

This application is a National Phase of PCT Patent Application No. PCT/CN2019/077090 having International filing date of Mar. 6, 2019, which claims the benefit of priority of Chinese Patent Application No. 201811450197.3 filed on Nov. 30, 2018. The contents of the above applications are all incorporated by reference as if fully set forth herein in their entirety.

FIELD AND BACKGROUND OF THE INVENTION

The present invention relates to the field of organic light emitting diode display technologies, and in particular, to a method for an organic light emitting device and an array substrate.

Although luminous efficiency inside an organic light emitting diode (OLED) device is close to 100%, the proportion of light which can be extracted outside the OLED device can still be improved. When light generated by the OLED device are transmitting therein, reflection, refraction, and total reflection occur at interfaces due to a mismatch of optical coefficients (such as a refractive index) of different materials. In order to obtain an OLED device with high efficiency, it is necessary to greatly improve its light extraction efficiency.

Increasing the light extraction efficiency (light extraction technology) of OLED devices is one of the important means to improve various performance parameters of the OLED devices. At present, methods for improving light extraction efficiency mainly include reducing total reflection, reducing microcavity resonance effect, and reducing waveguide effects. By increasing roughness of an exiting surface, coating microspheres on the exiting surface, and covering microlenses are major means of reducing total reflection.

There are some disclosed patents specifically designed for reducing total reflection, reducing microcavity resonance effects, and reducing waveguide effects. For example, U.S. Pat. No. 8,466,484 uses a thermal printing method to form a hole transport material (HTM) on a cathode to form different film morphology to adjust microcavity resonance effect to improve the light extraction efficiency of an organic light emitting device. Although this method can produce films with different morphology, the need for a regular matrix shape is difficult to achieve. U.S. Pat. No. 8,917,014 uses a meniscus coating method to add a structured layer with scattering particles (connecting a planarization layer) to a flat surface to improve light extraction efficiency. U.S. Pat. No. 9,130,195 B2 also forms special regular shapes at a light exiting interface or in a region close to the light exiting interface to increase the light extraction efficiency of components. However, it is quite difficult to form regular shapes and sizes on an outwardly convex pattern depending on properties of materials.

In order to solve the above technical problem, the present invention provides an organic light emitting device and an array substrate, which adds a light extraction layer on a light emitting side of the organic light emitting device, thereby increasing the light extraction efficiency of the organic light emitting device.

SUMMARY OF THE INVENTION

To solve the above problems, the present invention provides an organic light emitting device, comprising:

a light emitting structure layer having a light emitting side; and a light extraction layer positioned on the light emitting side of the light emitting structure layer, wherein the light extraction layer comprises at least one refractive layer, wherein each of the refractive layers comprises:

a plurality of first light refraction bodies distributed in an array on a same layer, wherein each of the first light refraction bodies has a first light incident surface and a first light emitting surface, and the first light incident surface faces the light emitting structure layer;

a plurality of second light refraction bodies, wherein each of the second light refraction bodies is positioned in a corresponding first light refraction body, each of the second light refraction bodies has a second light incident surface facing the first light incident surface, and a second light emitting surface faces the first light emitting surface; and a polymer layer covering the first light emitting surfaces of the first light refraction bodes.

In an embodiment of the present invention, a refractive index of the polymer layer is less than or equal to a refractive index of the first light refraction bodies, and the refractive index of the first light refraction bodies is less than a refractive index of the second light refraction bodies.

In an embodiment of the present invention, the light extraction layer further comprises a first polymer layer, the first light refraction bodies of the refractive layers cover the first polymer layer, and the refractive index of the polymer layer is greater than or equal to a refractive index of the first polymer layer.

In an embodiment of the present invention, each of the first light refraction bodies comprises a hemispherical polymer structure having a plane and a first spherical surface, the plane is the first light incident surface, the first spherical surface is the first light emitting surface, and the hemispherical polymer structure has a diameter ranging between 1 um and 50 um.

In an embodiment of the present invention, each of the second light refraction bodies comprises a spherical polymer structure having a second spherical surface, the second light incident surface and the second light emitting surface are distributed on the second spherical surface, and the spherical polymer structure has a diameter ranging between 0.1 um and 20 um.

In an embodiment of the present invention, each of the refractive layers further comprises a third inorganic layer covering the polymer layer, the light extraction layer further comprises: a first inorganic layer covering the light emitting structure layer; and a second inorganic layer covering the first inorganic layer; wherein a number of the refractive layers is two or more, and the refractive layers are laminated.

In an embodiment of the present invention, the light emitting structure layer comprises: a first electrode; an organic light emitting layer disposed on the first electrode; a second electrode disposed on the organic light emitting layer; and an electrode cover layer covering the second electrode; wherein the light extraction layer is disposed on the electrode cover layer; wherein the first electrode is a reflective electrode, the second electrode is a transparent or semi-transparent electrode, and a side where the second electrode is positioned is the light emitting side; and wherein the first electrode is a cathode, and the second electrode is an anode; or the second electrode is the cathode, and the first electrode is the anode.

In an embodiment of the present invention, from the anode to the cathode, the organic light emitting layer is sequentially stacked with a hole injection layer, a hole transport layer, an electron blocking layer, a luminescent material layer, a hole blocking layer, an electron transport layer, and an electron injection layer, wherein the organic light emitting device comprises a plurality of light emitting units, and wherein the light emitting units are at least one of a red light emitting unit, a blue light emitting unit, a filter light emitting unit, a white light emitting unit, and a yellow light emitting unit.

In an embodiment of the present invention, the light emitting units correspond to the first light refraction bodies, and the light emitting units being in one-to-one correspondence with the first light refraction bodies account for 30% or more of the light emitting units; and wherein each of the light emitting units has a minimum width, and a diameter of each of the first light refraction bodies is different from the minimum width of each of the light emitting units by between 1% and 20%.

The present invention further provides an array substrate, comprising: a base layer; an array layer covering the base layer, the array layer comprising a plurality of pixel cells; and the organic light emitting device according to claim 1 disposed on the array layer; wherein each light emitting unit of the organic light emitting device corresponds to one of the pixel units.

In the organic light emitting device and the array substrate of the present invention, the light extraction efficiency of the organic light emitting device can be increased by adding a light extraction layer to the organic light emitting structure. Moreover, the structure of the present invention is simple to set up, effectively solving the problems that light extraction are difficult to be realized in the prior art and realizing the preparation of a high-efficiency OLED device.

BRIEF DESCRIPTION OF THE SEVERAL VIEWS OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

Figure 1:
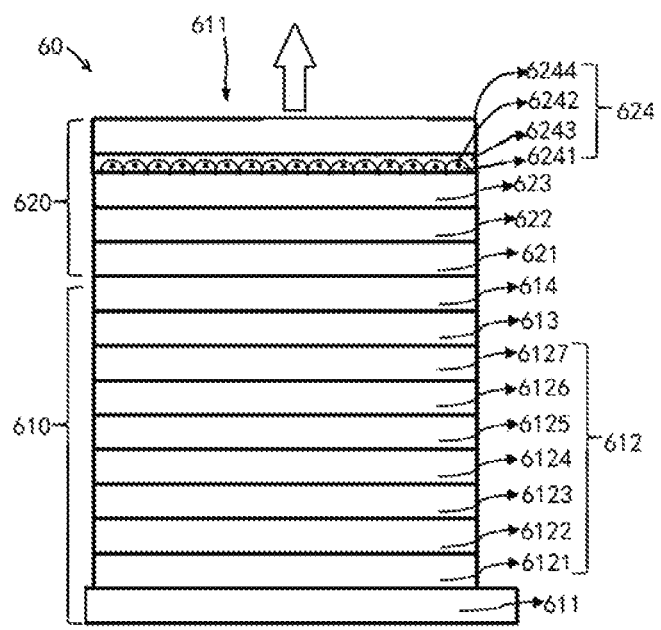
FIG. 1 is a structural diagram of a structure of an organic light emitting device according to an embodiment of the present invention.

Wherein
1 array substrate;
10 base layer; 20 array layer; 30 passivation layer; 40 planarization layer; 50 pixel defining layer; 60 organic light emitting device;
201 barrier layer; 202 active layer; 203 first gate insulating layer; 204 first gate layer; 205 second gate insulating layer; 206 second gate layer; 207 dielectric layer; 208 source; 209 drain;
51 slot; 52 pixel unit; 61 lighting unit;
610 light emitting structure layer; 620 light extraction layer;
611 first electrode; 612 organic light emitting layer; 613 second electrode; 614 electrode covering layer;
6121 hole injection layer; 6122 hole transport layer; 6123 electron blocking layer; 6124 luminescent material layer; 6125 hole blocking layer; 6126 electron transport layer; 6127 electron injection layer;
621 first inorganic layer; 622 second inorganic layer; 623 first polymer layer; 624 refractive layer;
6241 first light refraction bodies; 6242 second light refraction bodies; 6243 second polymer layer; 6244 third inorganic layer;
62411 first light incident surface; 62412 first light emitting surface; 62421 second light incident surface; 62422 second light emitting surface;
611 light emitting side.

DETAILED DESCRIPTION OF SPECIFIC EMBODIMENTS OF THE INVENTION

The embodiments of the present invention are described in detail below, and the examples of the embodiments are illustrated in the drawings, wherein the same or similar reference numerals indicate the same or similar elements or elements having the same or similar functions. The embodiments described below with reference to the drawings are intended to be illustrative of the invention and are not to be construed as limiting.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

As shown in FIG. 1, in an embodiment, an organic light emitting device 60 of the present invention includes a light emitting structure layer 610, and a light extraction layer 620. The light emitting structure layer 610 has a light emitting side 611, and the light extraction layer 620 is located on the light emitting side 611 of the light emitting structure layer 610.

The light emitting structure layer 610 includes a first electrode 611, an organic light emitting layer 612, a second electrode 613, and an electrode covering layer 614 ranged from bottom to top. The organic light emitting layer 612 is disposed on the first electrode 611; the second electrode 613 is disposed on the organic light emitting layer 612; the electrode covering layer 614 covers the second electrode 613, the second electrode 613 is the light emitting side 611.

The light emitting structure layer 610 provided in the present embodiment adopts the following structure: the first electrode 611 is an anode, and the anode is a reflective electrode. The reflective electrode is a reflective metal grid line made of a metal material such as silver, aluminum, copper, iron, zinc, gold, rhenium, molybdenum, magnesium, or titanium. The second electrode 613 is a cathode which is a transparent or translucent electrode. Material used for the cathode is a transparent or semi-transparent conductive film made of indium tin oxide, aluminum-doped zinc oxide material, silver nanowire, graphene nanowire, organic conductive material or the like. From the anode to the cathode, a hole injection layer 6121, a hole transport layer 6122, an electron blocking layer 6123, a luminescent material layer 6124, a hole blocking layer 6125, an electron transport layer 6126, and an electron injection layer 6127 are sequentially stacked from bottom to top in the organic light emitting layer 612. The electrode covering layer 614 is a cathode covering layer. The cathode covering layer is coated on the cathode to protect the cathode. Generally, a transparent metal nanomaterial such as silver, aluminum, copper, iron, zinc, gold, lanthanum, molybdenum or magnesium or a transparent metal oxide material can be used as material of the cathode covering layer.

Figure 3:
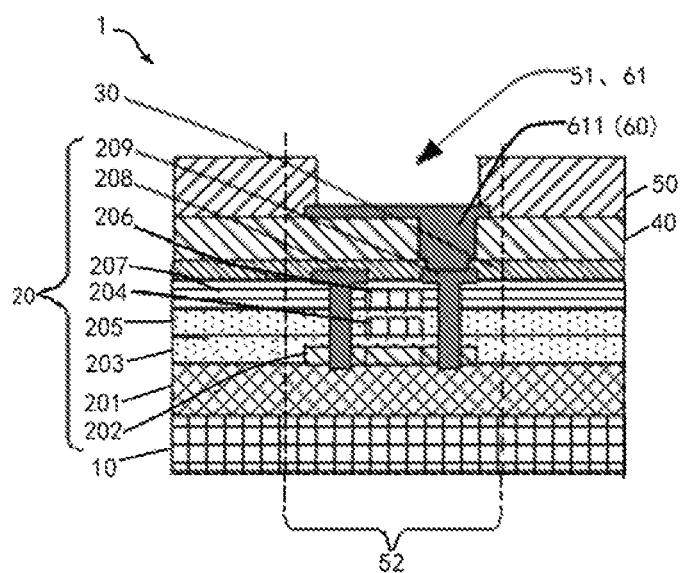
FIG. 3 is a light path diagram of light refracted by a light extraction layer according to an embodiment of the present invention.

In the present embodiment, the organic light emitting device 60 has a plurality of light emitting units 61 (see FIG. 3). Based on the different color selection of the emitting light, the light emitting units 61 are at least one of a red light emitting unit, a blue light emitting unit, a filtered light emitting unit, a white light emitting unit, and a yellow light emitting unit. A color of the light emitted by each of the light emitting units 61 is determined by material of the luminescent material layer 6124 to which it corresponds.

The light extraction layer 620 is disposed above the electrode covering layer 614. The light extraction layer 620 has a first inorganic layer 621, a second inorganic layer 622, a first polymer layer 623, and a refractive layer 624. The first inorganic layer 621 covers the electrode covering layer 614 to protect the electrode covering layer 614. The second inorganic layer 622 is coated on the first inorganic layer 621, and the second inorganic layer 622 has a function of blocking water and oxygen. The first polymer layer 623 is coated on the second inorganic layer 622, and the refractive layer 624 is coated on the first polymer layer 623.

In the present embodiment, the first inorganic layer 621 is a non-absorptive inorganic film of visible light (wavelength of 380-780 nm). Material of the first inorganic layer 621 can be inorganic salt such as lithium fluoride, sodium fluoride, potassium fluoride, sodium chloride, potassium chloride or the like; or metal material such as transparent metal material such as aluminum, silver, bismuth or magnesium; or a transparent metal oxide material such as one of alumina, zirconia, titania, indium tin oxide, zinc oxide or the like.

Material used for the second inorganic layer 622 can be selected from one of silicon oxide, silicon oxynitride, aluminum oxide, titanium oxide, and the like. Material of the first polymer layer 623 can be selected from one of hexamethyldimethylsilyl ether, plasma polymerized hexamethyl disiloxane (HMDSO), polyacrylates, polycarbonates, polystyrenes, and polyacryls. The first polymer layer 623 can be formed by chemical vapor deposition or inkjet printing or blade coating during the preparation process.

The refractive layer 624 includes a plurality of first light refraction bodies 6241, a plurality of second refraction bodies 6242, a second polymer layer 6243, and a third inorganic layer 6244.

Figure 2:
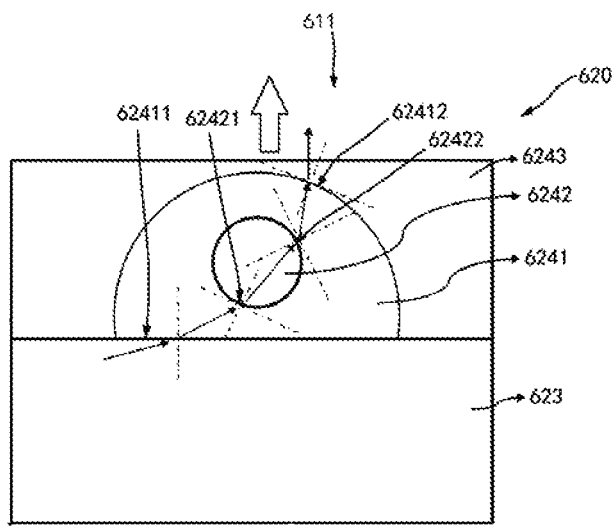
FIG. 2 is a structural diagram of an array substrate according to an embodiment of the present invention, mainly showing a correspondence relationship between a structure of an array substrate and pixel units and light emitting units.

The plurality of first light refraction bodies 6241 are arranged in an array on the same layer. In the present embodiment, the plurality of first light refraction bodies 6241 are arranged in an array on the first polymer layer 623. As shown in FIG. 2, each of the first light refraction bodies 6241 has a first light incident surface 62411 and a first light emitting surface 62412, and the first light incident surface 62411 faces the light emitting structure layer 610. In the present embodiment, each of the first light refraction bodies 6241 comprises a hemispherical polymer structure having a plane and a first spherical surface, the plane is the first light incident surface 62411, the first spherical surface is the first light emitting surface 62412. The hemispherical polymer structure has a diameter ranging between 1 um and 50 um, preferably from 5 um to 20 um. Material used for the first light refraction bodies 6241 is one of materials such as hexamethyldimethylsilyl ether, Plasma Polymerized HMDSO, polyacrylates, polycarbonates, polystyrenes, polyimides, and the like.

Referring to FIG. 2, each second light refraction bodies 6242 is located in a corresponding first light refraction body 6241, and each of the second light refraction bodies 6242 has a second light incident surface 62421 and a second light emitting surface 62422. The second light incident surface 62421 faces the first light incident surface 62411, and the second light emitting surface 62422 faces the first light emitting surface 62212. In the present embodiment, each of the second light refraction bodies 6242 is a spherical polymer structure having a second spherical surface. The second light incident surface 62421 and the second light emitting surface 62422 are distributed on the second spherical surface. The second light incident surface 62421 and the second light emitting surface 62422 constitute the second spherical surface, and a boundary line between the second light incident surface 62421 and the second light emitting surface 62422 is not defined on the second spherical surface. The spherical polymer structure has a diameter ranges from 0.1 um to 20 um, preferably from 0.4 um to 10 um. Material used for the second light refraction body 6242 can also be selected from one of the materials such as hexamethyldimethylsilyl ether, Plasma Polymerized HMDSO, polyacrylates, polycarbonates, polystyrenes, polyimides, and the like.

As shown in FIG. 2, the second polymer layer 6243 covers the first light emitting surface 62412 of all the first light refraction bodies 6241. The second polymer layer 6243 can be formed by inkjet printing or coating, and the second polymer layer 6243 covers all of the first light refraction bodies 6241 so that the surface is flat. Material used for the second polymer layer 6243 can also be one of hexamethyldimethylsilyl ether, Plasma Polymerized HMDSO, polyacrylates, polycarbonates, polystyrenes, polyimides, and the like.

As shown in FIG. 1, the third inorganic layer 6244 covers the second polymer layer 6243. Material used for the third inorganic layer 6244 can be one of silicon oxide, silicon oxynitride, aluminum oxide, titanium oxide, and the like.

In order to achieve a better light extraction effect, in the present embodiment, a refractive index of the second polymer layer 6243 is greater than or equal to a refractive index of the first polymer layer 623. The refractive index of the second polymer layer 6243 is less than or equal to the refractive index of a first light refractor 6241, and a refractive index of the first photorefractive body 6241 is smaller than a refractive index of the second light refraction bodies 6242. In the present embodiment, the refractive index of the first polymer layer 623 is generally greater than or equal to 1.5 and less than 1.6. The first refraction body has a refractive index greater than or equal to 1.5, preferably greater than 1.7 and less than or equal to 1.8. The second refraction body has a refractive index greater than 1.8, more preferably greater than 2.0 and less than or equal to 2.5. The second polymer layer 6243 has a refractive index greater than or equal to 1.5, preferably, the second polymer layer 6243 has a refractive index greater than or equal to 1.6 less than 1.7.

As shown in FIG. 2, after entering the first polymer layer 623 from the light emitting structure layer 610, the light entering the first light refraction bodies 6241 and being refracted by the first light refraction bodies 6241 and the second light refractor 6242, and then enters the second polymer layer 6243. After being refracted by the second polymer layer 6243, the light emitting from the light emitting side 611.

In order to achieve a better light extraction effect, in the present embodiment, the light emitting units 61 correspond to the first light refraction bodies 6241, and the light emitting units 61 being in one-to-one correspondence with the first light refraction bodies 6241 account for 30% or more of the light emitting units.

In the present embodiment, the light extraction layer 620 can be provided with one layer or multiple layers. When the number of layers of the light extraction layer 620 is two or more, the light extraction layer 620 is laminated.

As shown in FIG. 3 and FIG. 1, the embodiment further provides an array substrate 1. The array substrate 1 includes a base layer 10, an array layer 20, a passivation layer 30, a planarization layer 40, a pixel defining layer 50, and an organic light emitting device 60. The array layer 20 is overlaid on the base layer 10, and the array layer 20 has a plurality of pixel units 52 therein. The organic light emitting device 60 is disposed on the array layer 20, wherein a first electrode 611 in the organic light emitting device 60 is formed above the pixel units 52. Each of the light emitting units 61 corresponds to one of the pixel units 52.

Generally, the array layer 20 is provided with a barrier layer 201, an active layer 202, a first gate insulating layer 203, a first gate layer 204, a second gate insulating layer 205, and a second gate 206, a dielectric layer 207, a source electrode 208, a drain electrode 209, and the like from the base layer 10. The source electrode 208 and the drain electrode 209 are disposed on the dielectric layer 207 and are correspondingly connected to the active layer 202 through the dielectric layer 207. The passivation layer 30 covers the dielectric layer 207, the source electrode 208, and the drain electrode 209. The planarization layer 40 is overlaid on the passivation layer 30. The first electrode 611 is disposed on the planarization layer 40 and passes through the planarization layer 40 and the passivation layer 30 to connect with the drain electrode 209. The pixel defining layer 50 is overlaid on the first electrode 611. The pixel defining layer 50 has a slot 51 corresponding to the first electrode 611. In the present embodiment, the first electrode 611 is an anode and is a reflective electrode. Then, the electron blocking layer 6123, the luminescent material layer 6124, the hole blocking layer 6125, the electron transport layer 6126, the electron injection layer 6127, the second electrode 613, the electrode covering layer 614, and the light extraction layer 620 are sequentially formed on the anode in the slot 51. The second electrode 613 is a cathode and is a transparent or translucent electrode.

In the actual manufacturing process, the light emitting units 61 have a minimum width to facilitate fabrication. The minimum width is determined by the width of the slot 51 in the pixel defining layer 50. The width of the slot 51 is designed according to the manufacturing process requirements of the light emitting structure, that is, the size of the pixel units 52. In order to facilitate the production and improve the illuminating effect, the diameter of the first light refraction bodies 6241 in the embodiment is different from the minimum width of the light emitting units 61 by 1%-20%, preferably 5%-10%.

Figure 4:
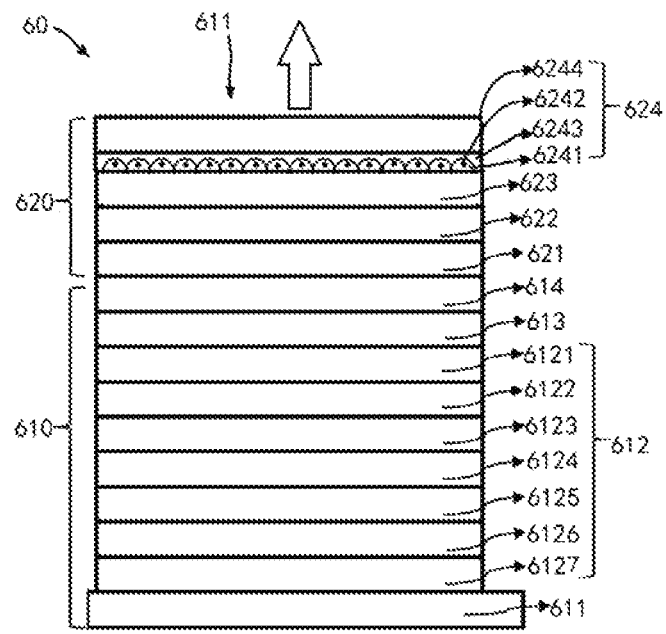
FIG. 4 is a structural diagram of an organic light emitting device according to another embodiment of the present invention.

As shown in FIG. 4, in another embodiment of the present invention, the layered structure of the light emitting structure layer 610 in the organic light emitting device 60 is different from that of the previous embodiment, and other structures, such as the light extracting layer 620, could adopt the solution of the previous embodiment.

As shown in FIG. 4, in the present embodiment, the light emitting structure layer 610 has a light emitting side 611, and the light extraction layer 620 is located on the light emitting side 611 of the light emitting structure. The light emitting structure layer 610 includes a first electrode 611, an organic light emitting layer 612, a second electrode 613, and an electrode covering layer 614 in order from bottom to top. The organic light emitting layer 612 is disposed on the first electrode 611; the second electrode 613 is disposed on the organic light emitting layer 612. The electrode covering layer 614 covers the second electrode 613, and the second electrode 613 is the light emitting side 611.

As shown in FIG. 4, the light emitting structure layer 610 provided in the present embodiment adopts the following structure: the first electrode 611 is a cathode, and the cathode is a reflective electrode. The reflective electrode is a reflective metal grid line made of a metal material such as silver, aluminum, copper, iron, zinc, gold, rhenium, molybdenum, magnesium, or titanium. The second electrode 613 is an anode which is a transparent or translucent electrode. The material used for the anode is a transparent or semi-transparent conductive film made of indium tin oxide, aluminum-doped zinc oxide material, silver nanowire, graphene nanowire, organic conductive material or the like. From the anode to the cathode, a hole injection layer 6121, a hole transport layer 6122, an electron blocking layer 6123, a luminescent material layer 6124, a hole blocking layer 6125, an electron transport layer 6126, and an electron injection layer 6127 are sequentially stacked from bottom to top in the organic light emitting layer 612. The electrode covering layer 614 is a cathode covering layer. The cathode covering layer is coated on the cathode to protect the cathode. Generally, a transparent metal nanomaterial such as silver, aluminum, copper, iron, zinc, gold, lanthanum, molybdenum or magnesium or a transparent metal oxide material can be used as a material of the cathode covering layer. The light extraction layer 620 is disposed above the electrode covering layer 614.

As shown in FIG. 3 and FIG. 4, the embodiment showing in FIG. 4 can also provide an array substrate 1 in FIG. 3. The array substrate 1 includes a base layer 10, an array layer 20, a passivation layer 30, a planarization layer 40, a pixel defining layer 50, and an organic light emitting device 60. The array layer 20 is overlaid on the base layer 10, and the array layer 20 has a plurality of pixel units 52 therein. The organic light emitting device 60 is disposed on the array layer 20, wherein a first electrode 611 in the organic light emitting device 60 is formed above the pixel units 52. Each of the light emitting units 61 corresponds to one of the pixel units 52.

In the present embodiment, the array layer 20 is provided with a barrier layer 201, an active layer 202, a first gate insulating layer 203, a first gate layer 204, a second gate insulating layer 205, and a second gate 206, a dielectric layer 207, a source electrode 208, a drain electrode 209, and the like from the base layer 10. The source electrode 208 and the drain electrode 209 are disposed on the dielectric layer 207 and are correspondingly connected to the active layer 202 through the dielectric layer 207. The passivation layer 30 covers the dielectric layer 207 and the drain electrode 209. The planarization layer 40 is overlaid on the passivation layer 30. The first electrode 611 is disposed on the planarization layer 40 and passes through the planarization layer 40 and the passivation layer 30 to connect with the source electrode 208 and drain electrode 209. The pixel defining layer 50 is overlaid on the first electrode 611. The pixel defining layer 50 has a slot 51 corresponding to the first electrode 611. In the present embodiment, the first electrode 611 is a cathode and is a reflective electrode. Then, the electron blocking layer 6123, the luminescent material layer 6124, the hole blocking layer 6125, the electron transporting layer 6126, the electron injecting layer 6127, the second electrode 613, the electrode cover layer 614, and the light extraction layer 620 are sequentially formed on the cathode in the slot 51. The second electrode 613 is an anode and is a transparent or translucent electrode.

The array substrate 1 of the present invention can be applied to various display devices, such as mobile phones, notebook computers, televisions, smart watches, virtual display devices, and the like.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting device, comprising:
   a light emitting structure layer having a light emitting side; and
   a light extraction layer positioned on the light emitting side of the light emitting structure layer, wherein the light extraction layer comprises at least one refractive layer, wherein each of the refractive layers comprises:
   a plurality of first light refraction bodies distributed in an array on a same layer, wherein each of the first light refraction bodies has a first light incident surface and a first light emitting surface, and the first light incident surface faces the light emitting structure layer;
   a plurality of second light refraction bodies, wherein each of the second light refraction bodies is positioned in a corresponding first light refraction body, each of the second light refraction bodies has a second light incident surface facing the first light incident surface, and a second light emitting surface faces the first light emitting surface; and
   a polymer layer covering the first light emitting surfaces of the first light refraction bodies;
   wherein, from the anode to the cathode, the organic light emitting layer is sequentially stacked with a hole injection layer, a hole transport layer, an electron blocking layer, a luminescent material layer, a hole blocking layer, an electron transport layer, and an electron injection layer, wherein the organic light emitting device comprises a plurality of light emitting units, and wherein the light emitting units are at least one of a red light emitting unit, a blue light emitting unit, a filter light emitting unit, a white light emitting unit, and a yellow light emitting unit;
   wherein the light emitting units correspond to the first light refraction bodies, and the light emitting units being in one-to-one correspondence with the first light refraction bodies account for 30% or more of the light emitting units; and
   wherein each of the light emitting units has a minimum width, and a diameter of each of the first light refraction bodies is different from the minimum width of each of the light emitting units by between 1% and 20%.

2. The organic light emitting device according to claim 1, wherein a refractive index of the polymer layer is less than or equal to a refractive index of the first light refraction bodies, and the refractive index of the first light refraction bodies is less than a refractive index of the second light refraction bodies.

3. The organic light emitting device according to claim 2, wherein the light extraction layer further comprises a first polymer layer, the first light refraction bodies of the refractive layers cover the first polymer layer, and the refractive index of the polymer layer is greater than or equal to a refractive index of the first polymer layer.

4. The organic light emitting device according to claim 1, wherein each of the first light refraction bodies comprises a hemispherical polymer structure having a plane and a first spherical surface, the plane is the first light incident surface, the first spherical surface is the first light emitting surface, and the hemispherical polymer structure has a diameter ranging between 1 um and 50 um.

5. The organic light emitting device according to claim 1, wherein each of the second light refraction bodies comprises a spherical polymer structure having a second spherical surface, the second light incident surface and the second light emitting surface are distributed on the second spherical surface, and the spherical polymer structure has a diameter ranging between 0.1 um and 20 um.

6. The organic light emitting device according to claim 1, wherein the light extraction layer further comprises:
   a first inorganic layer covering the light emitting structure layer; and
   a second inorganic layer covering the first inorganic layer.

7. The organic light emitting device according to claim 1, wherein the light emitting structure layer comprises:
   a first electrode;
   an organic light emitting layer disposed on the first electrode;
   a second electrode disposed on the organic light emitting layer; and
   an electrode covering layer covering the second electrode;
   wherein the light extraction layer is disposed on the electrode covering layer;
   wherein the first electrode is a reflective electrode, the second electrode is a transparent or semi-transparent electrode, and a side where the second electrode is positioned is the light emitting side; and
   wherein the first electrode is a cathode, and the second electrode is an anode; or the second electrode is the cathode, and the first electrode is the anode.

8. An array substrate, comprising:
   a base layer;
   an array layer covering the base layer, the array layer comprising a plurality of pixel cells; and
   the organic light emitting device according to claim 1 disposed on the array layer;
   wherein each light emitting unit of the organic light emitting device corresponds to one of the pixel units.

* * * * *